United States Patent
Hikosaka et al.

(10) Patent No.: US 8,399,896 B2
(45) Date of Patent: Mar. 19, 2013

(54) SEMICONDUCTOR LIGHT EMITTING DEVICE AND METHOD OF MANUFACTURING THE SAME

(75) Inventors: Toshiki Hikosaka, Tokyo (JP); Tomonari Shioda, Kanagawa-ken (JP); Yoshiyuki Harada, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/875,503

(22) Filed: Sep. 3, 2010

(65) Prior Publication Data

US 2011/0204394 A1 Aug. 25, 2011

(30) Foreign Application Priority Data

Feb. 25, 2010 (JP) .................................. 2010-040969

(51) Int. Cl.
*H01L 33/30* (2010.01)
*H01L 33/32* (2010.01)

(52) U.S. Cl. ........... 257/94; 257/E33.027; 257/E33.025; 438/47

(58) Field of Classification Search .................... 257/94, 257/98, E33.027, E33.025; 438/47
See application file for complete search history.

(56) References Cited

U.S. PATENT DOCUMENTS

| 7,547,909 | B2 | 6/2009 | Park | |
|---|---|---|---|---|
| 2005/0145860 | A1* | 7/2005 | Tanizawa | 257/85 |
| 2008/0315224 | A1 | 12/2008 | Kang et al. | |
| 2009/0072262 | A1* | 3/2009 | Iza et al. | 257/98 |
| 2010/0187497 | A1 | 7/2010 | Nago et al. | |

FOREIGN PATENT DOCUMENTS

| JP | 2004-297098 | 10/2004 |
|---|---|---|
| JP | 2004-343147 | 12/2004 |
| KR | 10-2004-0029165 | 4/2004 |
| KR | 10-0482511 | 4/2005 |
| KR | 10-2009-0002239 | 1/2009 |

OTHER PUBLICATIONS

U.S. Appl. No. 12/871,285, filed Aug. 30, 2010, Tachibana et al.
Office Action issued Jan. 20, 2012, in Korean Patent Application No. 10-2010-0087451 (with English-language translation).
U.S. Appl. No. 13/029,416, filed Feb. 17, 2011, Hikosaka, et al.
U.S. Appl. No. 13/032,907, filed Feb. 23, 2011, Hwang, et al.

* cited by examiner

*Primary Examiner* — Teresa M Arroyo
*Assistant Examiner* — Whitney T Moore
(74) *Attorney, Agent, or Firm* — Oblon, Spivak, McClelland, Maier & Neustadt, L.L.P.

(57) ABSTRACT

According to one embodiment, a semiconductor light emitting device includes n-type and p-type semiconductor layers, barrier layers, and a well layer. The n-type and p-type semiconductor layers and the barrier layers include nitride semiconductor. The barrier layers are provided between the n-type and p-type semiconductor layers. The well layer is provided between the barrier layers, has a smaller band gap energy than the barrier layers, and includes InGaN. At least one of the barrier layers includes first, second, and third layers. The second layer is provided closer to the p-type semiconductor layer than the first layer. The third layer is provided closer to the p-type semiconductor layer than the second layer. The second layer includes $Al_xGa_{1-x}N$ ($0<x\leqq0.05$). A band gap energy of the second layer is larger than the first and third layers. A total thickness of the first and second layers is not larger than the third layer.

20 Claims, 7 Drawing Sheets

SEMICONDUCTOR LIGHT EMITTING DEVICE AND METHOD OF MANUFACTURING THE SAME

CROSS-REFERENCE TO RELATED APPLICATIONS

This application is based upon and claims the benefit of priority from the prior Japanese Patent Application No. 2010-040969, filed on Feb. 25, 2010; the entire contents of which are incorporated herein by reference.

FIELD

Embodiments described herein relate generally to a semiconductor light emitting device and a method for manufacturing the same.

BACKGROUND

To improve the light emitting efficiency of a light emitting device including a nitride semiconductor, a quantum well structure in which an InGaN well layer is sandwiched between barrier layers with a band gap energy larger than that of the well layer is used.

For such a light emitting device, crystal needs to be grown at a lowest possible temperature for facilitating the incorporation of In in the formation of the well layer. However, as the temperature for the crystal growth becomes lower, the crystalline quality becomes more deteriorated. Accordingly, to enhance the efficiency of the semiconductor light emitting device, it is important to form a high-quality crystal while ensuring the incorporation of In.

In JP-A 2004-297098 (Kokai), a nitride semiconductor light emitting device is described in which intermediate layers made of $Al_dGa_{1-d}N$ ($0.30 \leq d \leq 1$) are formed between well layers and barrier layers of an active layer in a quantum well structure. The intermediate layers are formed respectively on all the well layers and has a band gap energy larger than that of the barrier layer. However, even this technology is used; there is room for improvement in terms of enhancing the light emitting efficiency.

DETAILED DESCRIPTION

Figure 1:
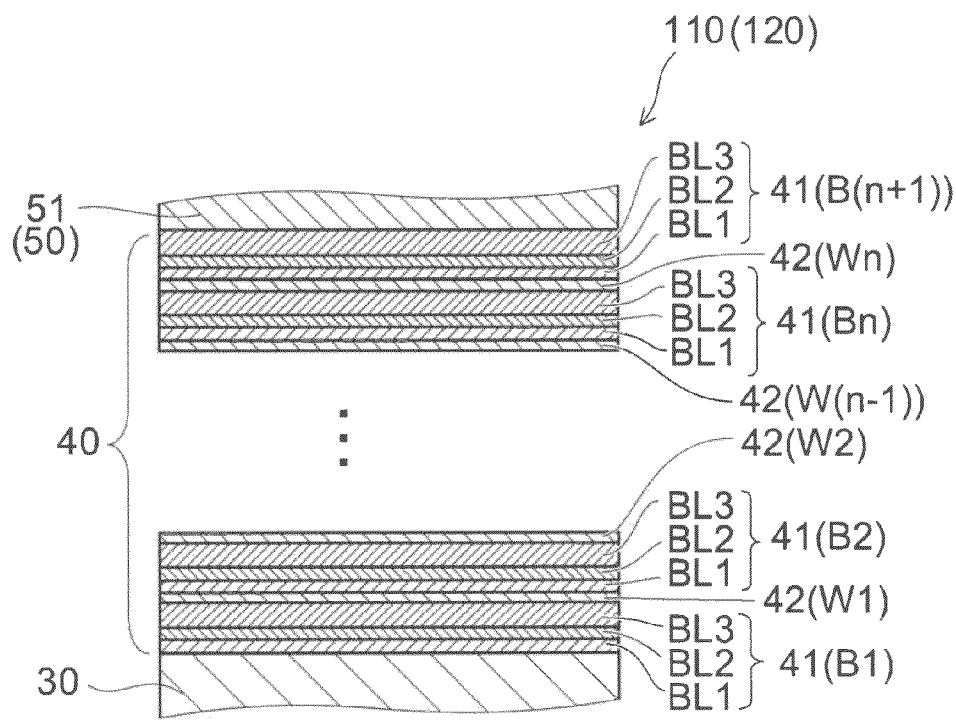
FIG. 1 is a schematic cross-sectional view showing part of a semiconductor light emitting device.

In general, according to one embodiment, a semiconductor light emitting device includes an n-type semiconductor layer, a p-type semiconductor layer, and an emitting layer. The n-type semiconductor layer includes a nitride semiconductor. The p-type semiconductor layer includes a nitride semiconductor. The emitting layer includes a plurality of barrier layers and a well layer. The plurality of barrier layers is provided between the n-type semiconductor layer and the p-type semiconductor layer. The barrier layers including a nitride semiconductor. The well layer is provided between the plurality of barrier layers. The well layer is having a band gap energy smaller than a band gap energy of the barrier layers. The well layer includes InGaN. at least one of the plurality of barrier layers includes a first layer, a second layer and a third layer. The second layer is provided closer to the p-type semiconductor layer than the first layer. The third layer is provided closer to the p-type semiconductor layer than the second layer. The second layer includes $Al_xGa_{1-x}N$ ($0<x\leq0.05$), where x is an atomic ratio of Al among group III elements. A band gap energy of the second layer being larger than a band gap energy of the first layer and a band gap energy of the third layer. A total thickness of the first layer and the second layer being not larger than a thickness of the third layer.

According to another embodiment, a semiconductor light emitting device includes a substrate, a semiconductor light emitting device includes an n-type semiconductor layer, a p-type semiconductor layer, and an emitting layer. The n-type semiconductor layer includes a nitride semiconductor. The p-type semiconductor layer includes a nitride semiconductor. The emitting layer includes a plurality of barrier layers and a well layer. The plurality of barrier layers is provided between the n-type semiconductor layer and the p-type semiconductor layer. The barrier layers including a nitride semiconductor. The well layer is provided between the plurality of barrier layers. The well layer is having a band gap energy smaller than a band gap energy of the barrier layers. The well layer includes InGaN. at least one of the plurality of barrier layers includes a first layer, a second layer and a third layer. The second layer is provided closer to the p-type semiconductor layer than the first layer. The third layer is provided closer to the p-type semiconductor layer than the second layer. The second layer includes $Al_xGa_{1-x}N$ ($0<x\leq0.05$), where x is an atomic ratio of Al among group III elements. A band gap energy of the second layer being larger than a band gap energy of the first layer and a band gap energy of the third layer. A total thickness of the first layer and the second layer being not larger than a thickness of the third layer.

According to yet another embodiment, a method is disclosed for manufacturing a semiconductor light emitting device. The semiconductor light emitting device includes an n-type semiconductor layer, a p-type semiconductor layer, a plurality of barrier layers, and a well layer. The n-type semiconductor layer includes a nitride semiconductor. The p-type semiconductor layer includes a nitride semiconductor. The plurality of barrier layers is provided between the n-type semiconductor layer and the p-type semiconductor layer. The barrier layers each include a nitride semiconductor. The well layer is provided between the plurality of barrier layers, has a band gap energy smaller than a band gap energy of the barrier layers, and includes InGaN. The method can form a first layer on the well layer and form a second layer on the first layer. The second layer includes $Al_xGa_{1-x}N$ ($0<x\leq0.05$), where x is an atomic ratio of Al among group III elements, and has a band gap energy larger than a band gap energy of the first layer. In addition, the method can form a third layer on the second layer at a temperature higher than a temperature for the forming of the first layer and the forming of the second layer. The third layer has a band gap energy smaller than the band gap energy of the second layer and has a thickness not smaller than a total thickness of the first layer and the second layer.

Exemplary embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

(First Embodiment)

FIG. 1 is a schematic cross-sectional view illustrating the configuration of a part of a semiconductor light emitting device according to a first embodiment.

Figure 2:
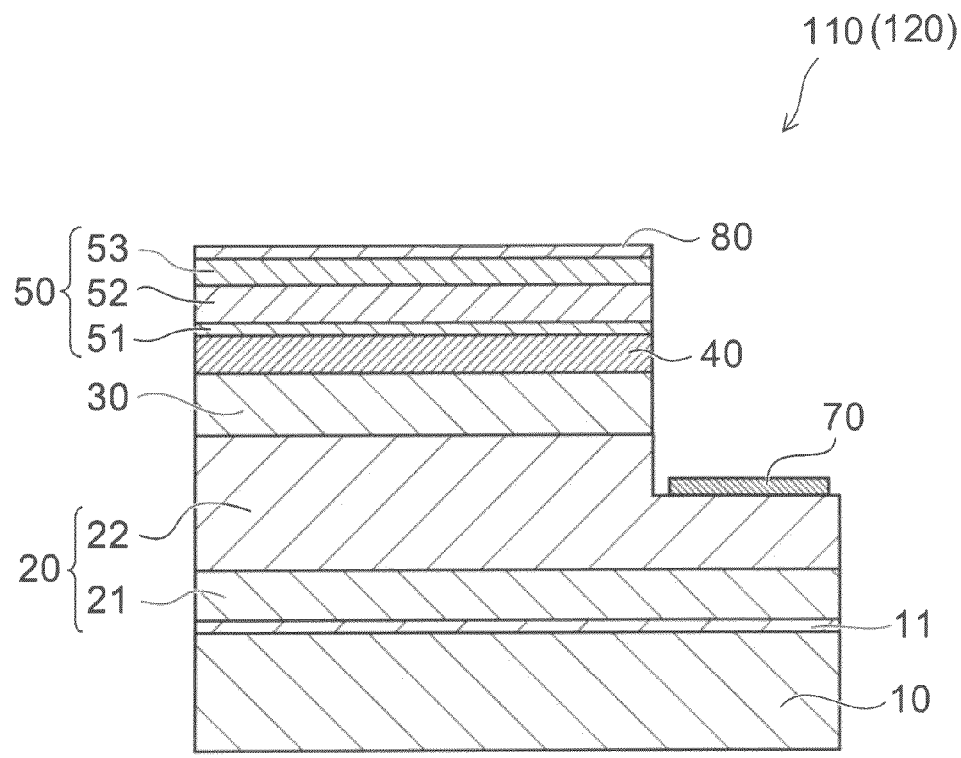
FIG. 2 is a schematic cross-sectional view showing the semiconductor light emitting device.

FIG. 2 is a schematic cross-sectional view illustrating the configuration of the semiconductor light emitting device according to the first embodiment.

As shown in FIG. 2, a semiconductor light emitting device 110 according to this embodiment includes an n-type semiconductor layer 20, a p-type semiconductor layer 50, and a light emitting layer 40 provided between the n-type semiconductor layer 20 and the p-type semiconductor layer 50.

The n-type semiconductor layer 20 and the p-type semiconductor layer 50 include a nitride semiconductor.

FIG. 1 schematically illustrates the detailed configuration of the light emitting layer 40 as a part of the semiconductor light emitting device.

As shown in FIG. 1, the light emitting layer 40 includes multiple barrier layers 41 and well layers 42 provided between the barrier layers 41 adjacent thereto.

The barrier layers 41 and the well layers 42 include a nitride semiconductor. A nitride semiconductor including indium (In) is used for the well layer 42.

The well layer 42 preferably has a thickness (film thickness) of, for example, not smaller than 1 nanometer (nm) and not larger than 5 nm.

For the well layer 42, for example, $In_{a1}Ga_{1-a1}N$ ($0<a1\leq0.4$) is used. a1 is an atomic ratio of In among group III elements.

The band gap energy of the barrier layer 41 is larger than that of the well layer 42. Specifically, when the barrier layer 41 includes In, the composition ratio of In in the barrier layer 41 is smaller than the composition ratio of In in the well layer 42. Accordingly, the band gap energy of the well layer 42 is smaller than the band gap energy of the barrier layer 41.

As described above, the barrier layers 41 and the well layers 42 are alternately stacked. Here, assuming that the number of the well layers 42 is "n", the well layers 42 include a first well layer W1 to an n-th well layer Wn. On the other hand, the barrier layers 41 include a first barrier layer B1 to an (n+1)-th barrier layer B(n+1).

As shown in FIG. 1, at least one of the barrier layers 41 includes: a first layer BL1; a second layer BL2 provided closer to the p-type semiconductor layer 50 than the first layer BL1; and a third layer BL3 provided closer to the p-type semiconductor layer 50 than the second layer BL2. The second layer BL2 includes $Al_xGa_{1-x}N$ ($0<x\leq0.05$), and the band gap energy of the second layer BL2 is larger than those of the first layer BL1 and the third layer BL3. x is an atomic ratio of Al among group III elements. Also, the total thickness (film thickness) of the first layer BL1 and the second layer BL2 is not larger than the thickness (film thickness) of the third layer BL3.

As illustrated in FIG. 1, for example, each of the barrier layers 41 has the first layer BL1, the second layer BL2, and the third layer BL3 described above. In other words, each of the barrier layers 41 includes the first layer BL1 provided on the well layer 42, the second layer BL2 provided on the first layer BL1, and the third layer BL3 provided on the second layer BL2. The first layer BL1 is provided in contact with the well layer 42, for example.

In the semiconductor light emitting device 110 according to this embodiment, crystalline quality and flatness of the barrier layers 41 are improved with such configuration, and the light emitting efficiency is improved.

The first layer BL1 serves to suppress strain to be applied to the well layer 42. This can suppress occurrence of defects such as In phase separation and pits due to the high In composition ratio. Thus, even in a long-wavelength region from a blue-green to red region, the high-quality light emitting layer 40 can be obtained.

The second layer BL2 has effects of suppressing occurrence of defects in formation of the barrier layer 41 and of improving the flatness of the barrier layer 41. The second layer BL2 also has an effect of preventing disappearance of the well layer 42 due to heating when the barrier layer 41 is formed at a higher temperature than the well layer 42.

It is preferable that the first layer BL1 and the second layer BL2 are as thin as possible. The first layer BL1 and the second layer BL2 preferably have a thickness of, for example, not smaller than one monolayer and not larger than 5 nm. The thickness of one monolayer is a size of one atomic. The thickness of the third layer BL3 may be not smaller than the total thickness (film thickness) of the first layer BL1 and the second layer BL2, and is preferably not smaller than 1 nm and not larger than 20 nm. The reason why the total thickness (film thickness) of the first layer BL1 and the second layer BL2 is set to not larger than the thickness (film thickness) of the third layer BL3 is that the third layer BL3 turns out to be a region with the highest crystalline quality in the barrier layer and is thus caused to mainly exert a confinement effect as the barrier layer, thereby enhancing the efficiency.

Moreover, for the first layer BL1, $Al_{y1}In_{z1}Ga_{1-y1-z1}N$ ($0\leq y1\leq1$, $0\leq z1\leq1$, $0\leq y1+z1\leq1$) is used, for example. y1 is an atomic ratio of Al among group III elements and z1 is an atomic ratio of In among group III elements. For the third layer BL3, $Al_{y2}In_{z2}Ga_{1-y2-z2}N$ ($0\leq y2\leq1$, $0\leq z2\leq1$, $0\leq y2+z2\leq1$) is used, for example. y2 is an atomic ratio of Al among group III elements and z2 is an atomic ratio of In among group III elements. The first layer BL1 and the third layer BL3 may be the same or different in composition.

As described above, in the semiconductor light emitting device 110, since the barrier layer 41 includes the first layer BL1, the second layer BL2, and the third layer BL3, defect formation in the barrier layer 41 is suppressed and the barrier layer 41 with smooth surface is obtained. As a result, an interface abruptness between the barrier layer 41 and the well layer 42 is improved. Further, disappearance of the well layer 42 due to heating can be suppressed when the barrier layer 41 is formed at a higher temperature than the well layer 42. Moreover, the well layer 42 having a uniform film thickness can be formed. Thus, the semiconductor light emitting device 110 having high light emitting efficiency can be obtained with high yield.

When the barrier layer 41 includes four or more layers, any three layers out of those layers that meet the above-described requirements correspond to the first layer BL1, the second layer BL2, and the third layer BL3, respectively. The first layer BL1 is in contact with the well layer 42.

One example of the specific configuration of the semiconductor light emitting device 110 will be described below. The semiconductor light emitting device 110 in this specific example is a light emitting diode (LED).

As shown in FIG. 2, in the semiconductor light emitting device 110, a buffer layer 11 is provided on a major surface of a substrate 10 made of, for example, sapphire, and a GaN base layer 21 and an n-type GaN contact layer 22 are provided thereon. The n-type GaN contact layer 22 is included in the n-type semiconductor layer 20. For convenience, the GaN base layer 21 may also be included in the n-type semiconductor layer 20.

Then, an n-type superlattice layer 30 and an active layer (the light emitting layer 40) are provided on the n-type GaN contact layer 22, and a p-type AlGaN layer 51 (electron overflow preventing layer), a p-type GaN layer 52, and a p-type GaN contact layer 53 are provided thereon in this order. The p-type AlGaN layer 51, the p-type GaN layer 52, and the p-type GaN contact layer 53 are included in the p-type semiconductor layer 50.

Thereafter, a part of the n-type GaN contact layer 22, i.e., the n-type semiconductor layer 20, as well as the n-type superlattice layer 30, the light emitting layer 40, and the p-type semiconductor layer 50, which correspond to that part, are removed. Then, an n-side electrode 70 is provided on the n-type GaN contact layer. On the other hand, a p-side electrode 80 is provided on the p-type GaN contact layer 53.

The semiconductor light emitting device 110 according to this embodiment is manufactured, for example, as follows.

First, after the buffer layer 11 is formed on the major surface of the substrate 10 made of, for example, sapphire, the GaN base layer 21 is crystal grown thereon. For the crystal growth, a metal organic chemical vapor deposition (MOCVD) method is used, for example. Besides that, a molecular beam epitaxy (MBE) method may be used to perform the crystal growth. The GaN base layer 21 has a thickness of, for example, 2 micrometers (μm). Moreover, the GaN base layer 21 may be doped with an n-type impurity.

For the substrate 10, various materials such as GaN, SiC, Si, and GaAs can be used other than sapphire.

Next, the n-type GaN contact layer 22 is crystal grown on the GaN base layer 21. Si is used as an n-type impurity by which the n-type GaN contact layer 22 is to be doped. However, as the n-type impurity, various elements such as Ge, Te, and Sn can be used other than Si. The doping amount of Si in the n-type GaN contact layer 22 is, for example, about $2\times10^{18}$ cm$^{-3}$, and the n-type GaN contact layer 22 has a thickness of, for example, 4 μm.

The GaN base layer 21 and the n-type GaN contact layer 22 are both grown at a growth temperature of 1000° C. to 1100° C.

For the n-type GaN contact layer 22, $In_{0.01}Ga_{0.99}N$ having a thickness of about 4 μm may be used instead of the GaN layer. The growth temperature in the case where the $In_{0.01}Ga_{0.99}N$ is used is, for example, 700° C. to 900° C.

Next, the n-type superlattice layer 30 is formed on the n-type GaN contact layer 22. As the n-type superlattice layer 30, for example, a superlattice structure can be used which includes undoped $In_{0.05}Ga_{0.95}N$ layers and undoped GaN layers alternately stacked. The film thickness of each of the $In_{0.05}Ga_{0.95}N$ layers is 1 nm and that of each of the GaN layers is 2 nm, for example. The growth temperature of both of the layers is, for example, 700° C. to 900° C. The n-type superlattice layer 30 may be doped with an n-type impurity such as Si.

Then, the light emitting layer 40 is formed on the n-type superlattice layer 30. For a carrier gas, nitrogen and/or hydrogen are used.

For example, to begin with, the first barrier layer B1 as a first one of the barrier layers is formed. At this time, the first layer BL1 including, for example, undoped GaN is first formed. The first layer BL1 has a thickness of, for example, 1 nm.

Thereafter, on the first layer BL1, the second layer BL2 including undoped $Al_xGa_{1-x}N$ ($0<x\leqq0.05$) is formed. The second layer BL2 has a thickness of, for example, 2 nm.

Subsequently, on the second layer BL2, the third layer BL3 including, for example, undoped GaN is formed. The third layer BL3 has a thickness of, for example, 9.5 nm.

Accordingly, the thickness of the barrier layer 41 is, for example, 12.5 nm at this time. In this way, the thicknesses of the first layer BL1 and the second layer BL2 (1 nm and 2 nm, respectively, in this example) are set smaller than the thickness of the third layer BL3 (9.5 nm in this example).

Then, on the third layer BL3, the first well layer W1 as a first one of the well layers is formed. For this well layer W1, for example, undoped $In_{0.15}Ga_{0.85}N$ is used, and the thickness thereof is, for example, 1.5 nm.

Thereafter, in the same manner as described above, the barrier layers 41 (second barrier layer B2 to n-th barrier layer Bn) and the well layers 42 (second well layer W2 to n-th well layer Wn) are alternately and repetitively formed. Then, the last (n+1)-th barrier layer B(n+1) is formed. Thus, the light emitting layer 40 having a multiple quantum well (MQW) structure is formed, in which the barrier layers 41 and the well layers 42 are alternately stacked. The above-described "n" is set to, for example, eight. The light emitting layer 40 may have a single quantum well (SQW) structure.

In the structure having the barrier layers 41 and well layers 42 alternately stacked, the first layer BL1 is provided between the second layer BL2 and the well layer 42. Thus, the strain to be applied to the well layer 42 is suppressed by the first layer BL1. Accordingly, the wavelength of emission in the light emitting layer 40 increases, and higher efficiency can be achieved.

The growth temperature of the well layer 42 is, for example, 600° C. to 800° C. The growth temperature of the third layer BL3 is higher than that of the well layer 42, and is for example, 700° C. to 1000° C. The growth temperature of the first layer BL1 and the second layer BL2 is not lower than that of the well layer 42, is lower than that of the third layer BL3, and is, for example, 600° C. to 1000° C. In this way, the third layer BL3 is formed at a higher temperature than the first layer BL1 and the second layer BL2. Thus, the crystalline quality of the third layer BL3 is improved, and the light emitting efficiency in the light emitting layer 40 is improved.

The above-described barrier layers 41 and well layers 42 are examples which are designed so that a photoluminescence wavelength of the light emitting layer 40 is 450 nm at room temperature.

The light emitting layer 40 may be doped with an n-type impurity such as Si or a p-type impurity such as Mg. Alternatively, the light emitting layer 40 may be isoelectronically doped with a group III element such as Al or In. Both of the well layers 42 and the barrier layers 41 may be doped with an impurity, or at least one of the well layers 42 and the barrier layers 41 may be doped with an impurity. Moreover, as to the barrier layer 41, all of the first layer BL1, the second layer BL2, and the third layer BL3 may be doped with an impurity, or at least one of the first layer BL1, the second layer BL2, and the third layer BL3 may be doped with an impurity.

Next, the p-type AlGaN layer 51 is formed on the light emitting layer 40. For the p-type AlGaN layer 51, $Al_{0.2}Ga_{0.8}N$ doped with a p-type impurity can be used. The p-type AlGaN layer 51 has a thickness of, for example, about 10 nm. The p-type AlGaN layer 51 functions as the electron overflow preventing layer. As the p-type impurity, Mg is used, for example, and the concentration of Mg is, for example, about $1 \times 10^{19}$ cm$^{-3}$. However, as the p-type impurity, various elements such as Zn and C can be used other than Mg. The growth temperature of $Al_{0.2}Ga_{0.8}N$ forming the p-type AlGaN layer 51 is, for example, 1000° C. to 1100° C.

Then, the p-type GaN layer 52 is formed on the p-type AlGaN layer 51. For the p-type GaN layer 52, a p-type GaN layer doped with Mg can be used. The p-type GaN layer 52 has a thickness of, for example, about 100 nm. As the p-type impurity, Mg can be used, and the concentration of Mg is, for example, about $1 \times 10^{19}$ cm$^{-3}$. The growth temperature of GaN forming the p-type GaN layer 52 is, for example, 1000° C. to 1100° C.

Thereafter, the p-type GaN contact layer 53 is formed on the p-type GaN layer 52. For the p-type GaN contact layer 53, Mg, for example, is used as the p-type impurity. The concentration of Mg is, for example, about $1 \times 10^{20}$ cm$^{-3}$, and the p-type GaN contact layer 53 has a thickness of, for example, about 10 nm.

The following device process is performed on the stacked structural body obtained by performing crystal growth of the layers as described above.

Specifically, the p-side electrode 80 is formed on the p-type GaN contact layer 53. For the p-side electrode 80, a palladium-platinum-gold (Pd/Pt/Au) composite film is used, for example. The Pd film has a thickness of, for example, 0.05 μm. The Pt film has a thickness of, for example, 0.05 μm. The Au film has a thickness of, for example, 0.05 μm. However, for the p-side electrode 80, a transparent electrode such as indium tin oxide (ITO) or highly reflective metal such as Ag can be used other than the composite film.

Thereafter, the stacked structural body described above is partially dry-etched to expose the n-type GaN contact layer 22, and the n-side electrode 70 is formed. For the n-side electrode 70, a titanium-platinum-gold (Ti/Pt/Au) composite film is used, for example. The Ti film has a thickness of, for example, about 0.05 μm. The Pt film has a thickness of, for example, about 0.05 μm. The Au film has a thickness of, for example, about 1.0 μm.

The semiconductor light emitting device 110 illustrated in FIG. 2 is thus manufactured.

FIGS. 3A to 5B are views illustrating conditions of surfaces of barrier layers.

Figures 3A, 3B:
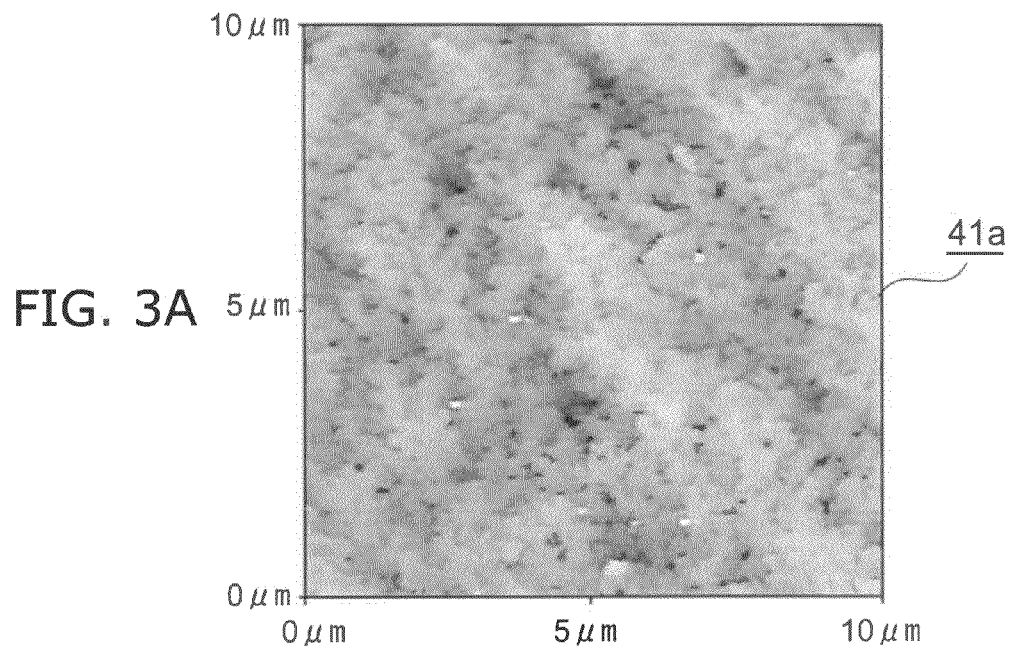
FIGS. 3A and 3B are diagrams showing conditions of a surface of a barrier layer.

Specifically, FIGS. 3A and 3B illustrate a surface of a barrier layer 41a having no second layer BL2.

Figure 4A:
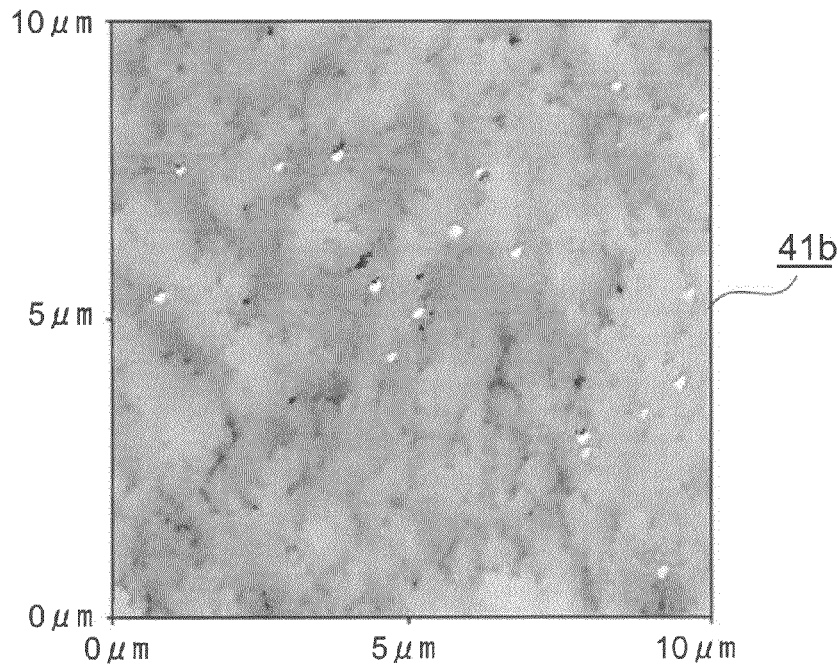
FIGS. 4A and 4B are diagrams showing conditions of a surface of a barrier layer.
Figure 4B:
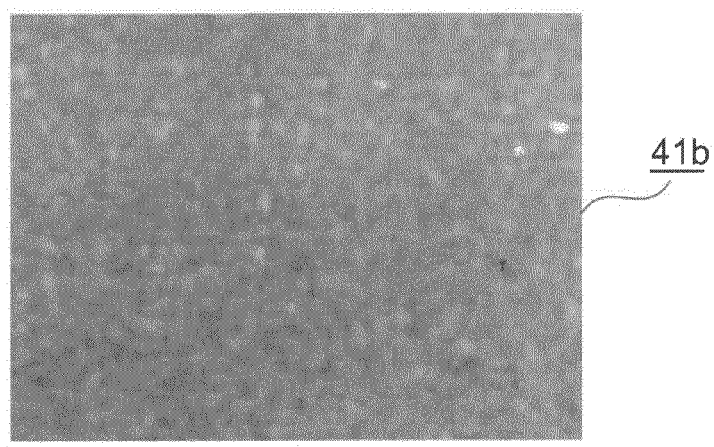

FIGS. 4A and 4B illustrate a surface of a barrier layer 41b having a second layer BL2 with an Al composition ratio of 0.5%.

Figure 5A:
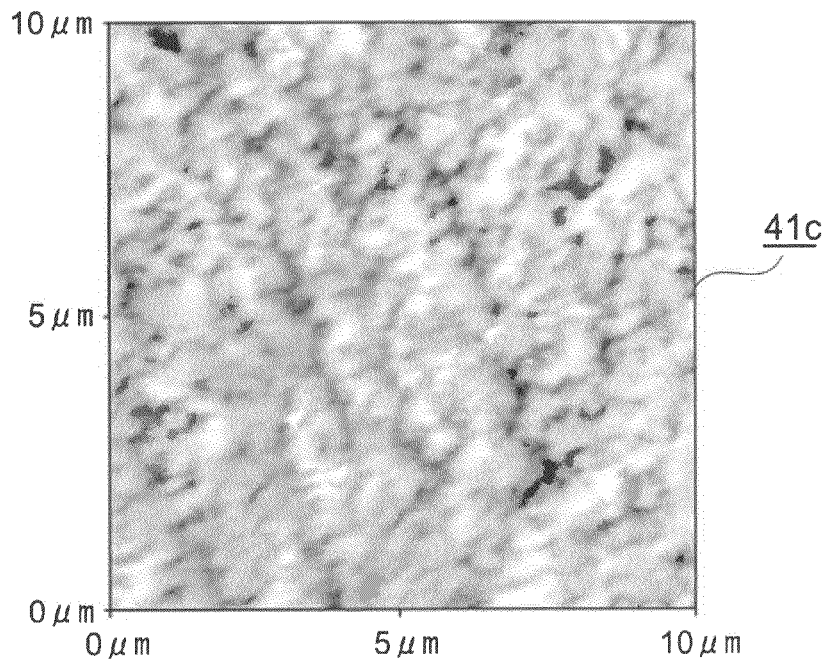
FIGS. 5A and 5B are diagrams showing conditions of a surface of a barrier layer.
Figure 5B:
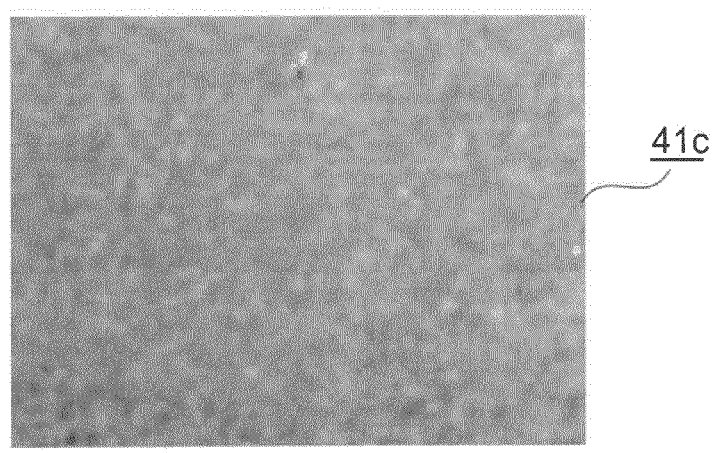

FIGS. 5A and 5B illustrate a surface of a barrier layer 41c having a second layer BL2 with an Al composition ratio of 5%.

FIGS. 3A, 4A, and 5A are atomic force microscope (AFM) images of the surfaces of the barrier layers 41a, 41b, and 41c, respectively. In these images, lighter portions indicate an area where the height of the surface is larger, and darker portions indicate an area where the height of the surface is smaller.

FIGS. 3B, 4B and 5B are images obtained by observing the surfaces of the barrier layers 41a, 41b, and 41c, respectively, with a fluorescence microscope. In these images, light portions indicate crystal defects.

The surface of the barrier layer 41b shown in FIG. 4A is more flat than those of the barrier layer 41a shown in FIG. 3A and the barrier layer 41c shown in FIG. 5A. Moreover, the barrier layer 41a shown in FIG. 3B has more crystal defects appearing than the barrier layer 41b shown in FIG. 4B and the barrier layer 41c shown in FIG. 5B. Furthermore, the barrier layer 41c shown in FIG. 5B has fewer crystal defects than the barrier layer 41b shown in FIG. 4B.

Figure 6A:
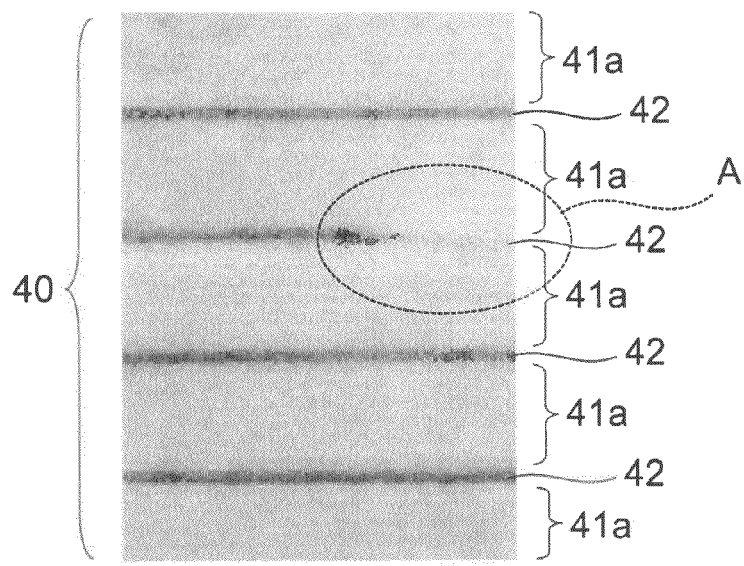
FIGS. 6A and 6B are diagrams showing part of the semiconductor light emitting device.
Figure 6B:
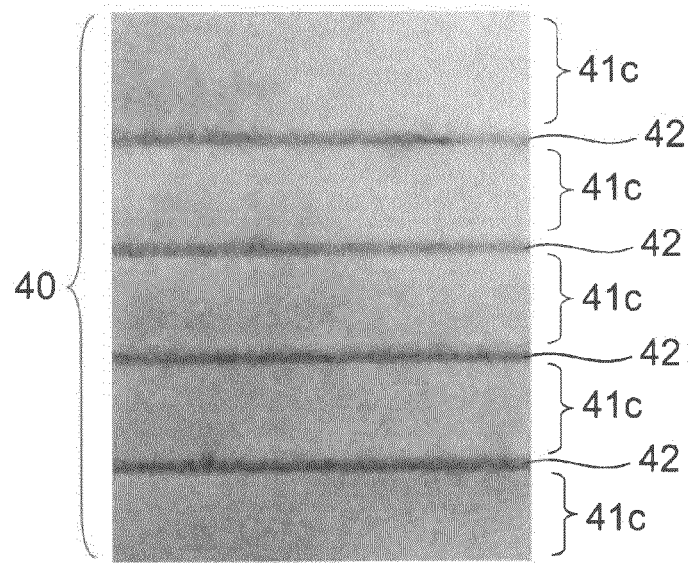

FIGS. 6A and 6B are diagrams each illustrating a cross-sectional transmission electron microscope (TEM) image of a part of the light emitting layer 40, i.e., a part of the semiconductor light emitting device.

Specifically, FIG. 6A illustrates the light emitting layer 40 having the well layers 42 and the barrier layers 41a described above. FIG. 6B illustrates the light emitting layer 40 having the well layers 42 and the barrier layers 41c described above.

In the light emitting layer 40 illustrated in FIG. 6A, disappearance is observed in a part of the well layer 42 as a portion indicated by a broken circle A in FIG. 6A. On the other hand, in the light emitting layer 40 illustrated in FIG. 6B, no disappearance of the well layers 42 is observed.

As described above, in the semiconductor light emitting device in which the barrier layers 41 has the second layer BL2, crystal defects in the barrier layers 41 are suppressed. This suppresses disappearance of the well layer 42 due to heating when growing the barrier layer 41.

Further, the first layer BL1 of the barrier layer 41 suppresses the strain between the well layer 42 and the second layer BL2. This improves the light emitting efficiency in the long-wavelength region.

Generally, in the case where the well layer 42 including InGaN is formed, fluctuation of the In composition ratio in the well layer 42 occurs. When the barrier layer 41 is formed on the well layer 42, the growth of the barrier layer 41 is inhibited in a region with a high In composition ratio. This makes it more likely for pits (crystal defects) to be formed in the barrier layer 41. These pits affect the flatness of the barrier layer 41.

When distribution occurs in the film thickness of the barrier layer 41, a sufficient quantum effect cannot be achieved. In addition, in formation of the barrier layer 41, the well layer 42 may partially decompose or disappear. Moreover, in the process of stacking the well layers 42 and the barrier layers 41, abnormal growth occurs inside the pit in a region with a high In composition ratio. Accordingly, when forming the p-type semiconductor layer 50 at a higher temperature than the light emitting layer 40 after the formation of the light emitting layer 40, deterioration of the light emitting layer 40 occurs starting from the abnormal growth portion. This affects the light emitting efficiency.

In the semiconductor light emitting device 110 according to this embodiment, formation of pits in the barrier layer 41 is significantly suppressed because the second layer BL2 including $Al_xGa_{1-x}N$ (0<x≦0.05) is provided. Accordingly, the barrier layer 41 having good surface flatness can be obtained. In other words, by providing the second layer BL2 including a small amount of Al in the barrier layer 41, lateral growth is facilitated during the growth of the barrier layer. As a result, the well layer 42 is sufficiently covered, and the flatness of the barrier layer 41 (e.g., the third layer BL3) to be stacked next is improved. Further, disappearance of the well layer 42 in formation of the barrier layer 41 is suppressed.

The semiconductor light emitting device according to this embodiment will be described by making comparison with comparative examples.

Figure 7A:
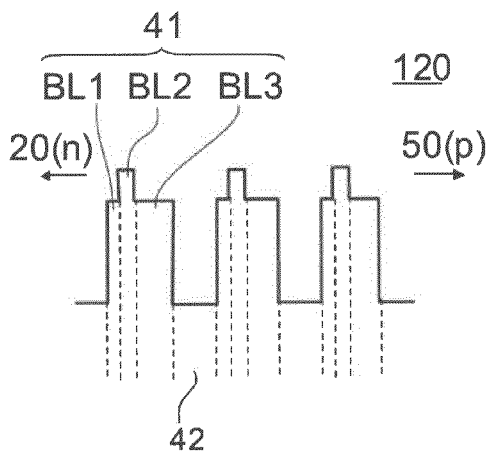
FIGS. 7A to 7E are schematic views showing the semiconductor light emitting device and comparative examples.

FIGS. 7A to 7E are schematic views illustrating the configurations of the semiconductor light emitting device according to this embodiment and semiconductor light emitting devices of the comparative examples. Specifically, each of FIGS. 7A to 7E shows, by way of a model, the energy band of a conduction band in a light emitting portion of the semiconductor light emitting device. FIG. 7A corresponds to a semiconductor light emitting device 120 according to a first example, and FIGS. 7B to 7E correspond to semiconductor light emitting devices 191 to 194 according to first to fourth comparative examples, respectively.

The semiconductor light emitting device 120 according to the first example has the same configuration as that of the semiconductor light emitting device 110 shown in FIG. 1. With reference to this drawing, the first example will be described below. The semiconductor light emitting device 120 is manufactured as follows.

First, a sapphire substrate treated by organic cleaning and acid cleaning is put into a reaction chamber of an MOCVD apparatus, and a buffer layer 11 made of GaN is formed with a thickness of 30 nm by using trimethylgallium (TMG) and ammonia ($NH_3$).

Then, an undoped GaN base layer 21 is formed with a thickness of 2 μm at 1120° C. by using nitrogen and hydrogen as a carrier gas, TMG and ammonia as a raw material gas, and silane ($SiH_4$) as an impurity raw material gas. Subsequently, an n-type GaN contact layer 22 is formed with a thickness of 4 μm.

Thereafter, in a nitrogen atmosphere, undoped GaN is formed with a thickness of 2 nm at 800° C. by using TMG and ammonia, and subsequently, trimethylindium (TMI) is further added thereto at the same temperature to form undoped $In_{0.07}Ga_{0.93}N$ with a thickness of 1 nm. After repeating the processes twenty times, silane is lastly added as an impurity raw material gas to form n-type GaN with a thickness of 2 nm. Thus, an n-type superlattice layer 30 is formed.

Subsequently, in a nitrogen atmosphere, a first layer BL1 made of undoped GaN is formed with a thickness of 1 nm at 800° C. by using TMG and ammonia. Further, a second layer BL2 made of undoped $Al_{0.005}Ga_{0.995}N$ is formed with a thickness of 2 nm at 800° C. by using trimethylaluminum (TMA), TMG, and ammonia.

Thereafter, at the substrate temperature of 850° C., a third layer BL3 made of undoped GaN is formed with a thickness of 9.5 nm by using TMG and ammonia. Thus, a first barrier layer B1 including the first to third layers BL1 to BL3 and having a total film thickness of 12.5 nm is formed.

Subsequently, at the substrate temperature of 730° C., a first well layer W1 made of undoped $In_{0.025}Ga_{0.75}N$ is formed with a thickness of 1.5 nm by using TMG, TMI, and ammonia.

Then, at the same temperature, a first layer BL1 made of undoped GaN to be a part of a second barrier layer B2 is formed with a thickness of 1 nm by using TMG and ammonia. Further, a second layer BL2 made of undoped $Al_{0.005}Ga_{0.995}N$ is formed with a thickness of 2 nm by using trimethylaluminum (TMA), TMG, and ammonia.

Thereafter, at the substrate temperature of 850° C., a third layer BL3 made of undoped GaN is formed with a thickness of 9.5 nm by using TMG and ammonia. Thus, the second barrier layer B2 including the first to third layers BL1 to BL3 and having a total film thickness of 12.5 nm is formed. The formation of the well layer 42, the first layer BL1, the second layer BL2, and the third layer BL3 is further repeated seven times to form a light emitting layer 40.

Then, in an atmosphere including nitrogen and hydrogen, a p-type AlGaN layer 51 is formed with a thickness of 10 nm at 1030° C. by using TMA, TMG, and ammonia and further using bis-cyclopentadienyl magnesium ($Cp_2Mg$) as an impurity raw material. Further, by using TMG and ammonia, a p-type GaN layer 52 is formed with a thickness of 80 nm, and a p-type GaN contact layer 53 is formed with a thickness of 5 nm.

After completion of the growth, the temperature is lowered to room temperature, and a part of the multilayer structure thus obtained is removed by dry etching until the n-type GaN contact layer 22 is exposed. Then, on the exposed n-type GaN contact layer 22, an n-side electrode 70 including Ti/Pt/Au is formed. Further, on the p-type GaN contact layer 53, a p-side electrode 80 including ITO is formed.

The comparative examples will be described below.

COMPARATIVE EXAMPLE 1

Figure 7B:
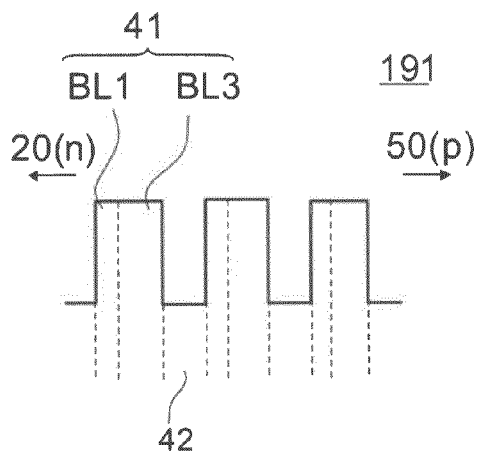

As shown in FIG. 7B, the semiconductor light emitting device 191 of the first comparative example is obtained as follows. A well layer 42 is formed at 730° C. Subsequently, as a barrier layer 41, a first layer made of undoped GaN is formed with a thickness of 2 nm, and a third layer BL3 made of undoped GaN is then formed with a thickness of 10.5 nm at 850° C. In other words, the second layer BL2 made of undoped $Al_{0.005}Ga_{0.995}N$ is not provided.

COMPARATIVE EXAMPLE 2

Figure 7C:
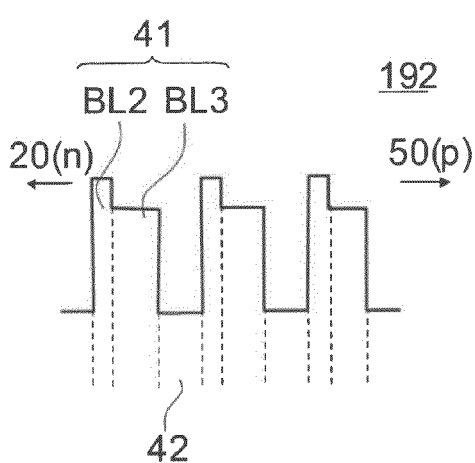

As shown in FIG. 7C, the semiconductor light emitting device 192 of the second comparative example is obtained as follows. A well layer 42 is formed at 730° C. Subsequently, as a barrier layer 41, a second layer BL2 made of undoped $Al_{0.005}Ga_{0.995}N$ is formed with a thickness of 2 nm, and a third layer BL3 made of undoped GaN is then formed with a thickness of 10.5 nm at 850° C. In other words, the first layer BL1 made of undoped GaN is not provided.

COMPARATIVE EXAMPLE 3

Figure 7D:
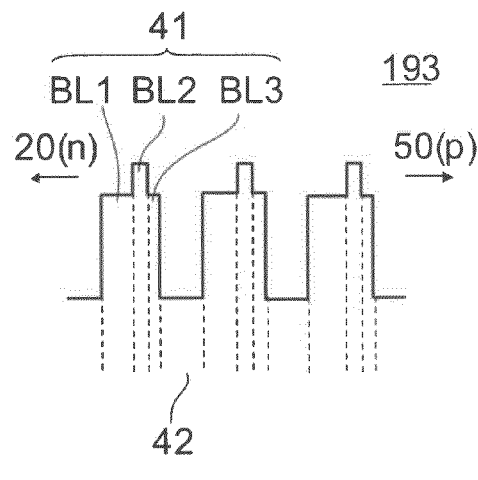

As shown in FIG. 7D, the semiconductor light emitting device 193 of the third comparative example is obtained as follows. A well layer 42 is formed at 730° C. Subsequently, as a barrier layer 41, a first layer BL1 made of undoped GaN is formed with a thickness of 7.5 nm, a second layer BL2 made of undoped $Al_{0.005}Ga_{0.995}N$ is then formed with a thickness of 2 nm, and a third layer BL3 made of undoped GaN is then formed with a thickness of 3 nm at 850° C. In other words, the first layer BL1 is thicker than the third layer BL3.

COMPARATIVE EXAMPLE 4

Figure 7E:
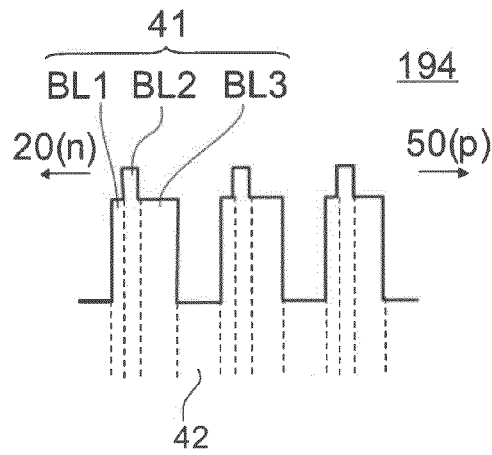

As shown in FIG. 7E, in the semiconductor light emitting device 194 of the fourth comparative example, a barrier layer 41 has a first layer BL1, a second layer BL2, and a third layer BL3. However, in the semiconductor light emitting device 194, undoped $Al_{0.15}Ga_{0.85}N$ is used for the second layer BL2. In other words, the Al composition ratio x in $Al_xGa_{1-x}N$ is 0.15, and does not satisfy $0<x\leq0.05$.

Figure 8:
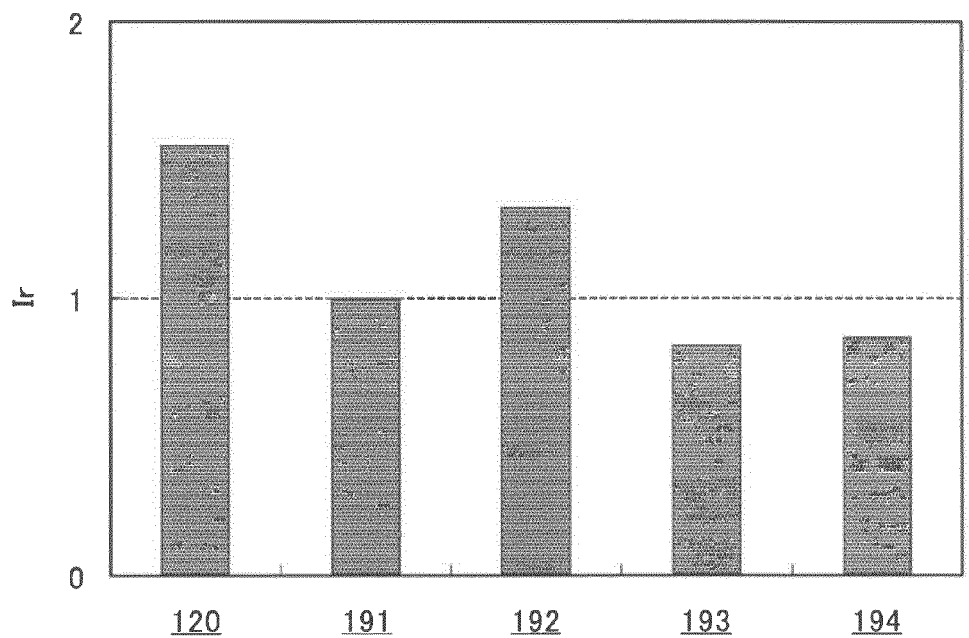
FIG. 8 is a graph showing characteristics of the semiconductor light emitting device and the comparative examples.

FIG. 8 is a graph illustrating characteristics of the semiconductor light emitting device according to this embodiment and the semiconductor light emitting devices according to the comparative examples.

Specifically, FIG. 8 shows a light emission output power at drive current of 20 mA is caused to flow. The vertical axis of FIG. 8 indicates a normalized light emission output Ir when assuming that a light emission output of the semiconductor light emitting device 191 of the first comparative example is 1.

A light emission wavelength is 500 nm, and blue-green light is emitted, in all of the semiconductor light emitting device 120 and the semiconductor light emitting devices 191 to 194 of the first to fourth comparative examples.

As shown in FIG. 8, the light emission output (normalized light emission output Ir) in the semiconductor light emitting device 120 according to this embodiment is higher than that of any of the comparative examples.

In the semiconductor light emitting device 120 according to the first example, the barrier layer 41 has the first layer BL1, the second layer BL2, and the third layer BL3 described above, and thus the barrier layer 41 with good flatness is formed.

In other words, in the semiconductor light emitting device 120, formation of pits (defects) in the barrier layer 41 is significantly suppressed because the second layer BL2 including $Al_xGa_{1-x}N$ ($0<x\leqq0.05$) is provided. Accordingly, the crystalline quality of the barrier layer is improved, and thus the barrier to layer 41 with good surface flatness can be obtained. In addition, disappearance of the well layer 42 in formation of the barrier layer 41 is suppressed, and thus the light emitting efficiency is improved. Further, a variation in the device characteristics is reduced.

Moreover, because the first layer BL1 is provided between the well layer 42 and the second layer BL2, defects and In phase separation which may occur in the well layer 42 are suppressed, and thus the crystalline quality of the well layer is improved.

Further, in the semiconductor light emitting device 120, a carrier confinement effect in the well layer 42 is enhanced.

Also, formation of the third layer BL3 at a high temperature improves the crystalline quality, which makes it possible to obtain the barrier layer 41 with better surface flatness. As a result, an interface abruptness between the barrier layer 41 and the well layer 42 is improved, and thus the light emitting efficiency is further improved.

The reason why the light emission output in the first comparative example is lower than that in the first example is considered to be because the well layer 42 partially disappears in the formation of the third layer BL3. Moreover, abnormal growth caused by the pits formed in the barrier layer 41 causes heat deterioration of the active layer (light emitting layer 40) in the formation of the p-type semiconductor layer 50 at a high temperature. Accordingly, light emission peak broadening is observed. This is considered to be the reason for the lowered light emission output.

The light emission output in the second comparative example is improved compared with the first comparative example. This is because disappearance of the well layer is suppressed by providing the second layer BL2 made of $Al_{0.005}Ga_{0.995}N$, thereby allowing a uniform well layer to be obtained.

However, the light emission output in the second comparative example is lower than that in the first example. In the second comparative example, the second layer BL2 and the well layer 42 are in direct contact with each other, and this leads to a large lattice mismatch between the second layer BL2 and the well layer 42. As a result, in the second comparative example, strain and defects in the well layer 42 tend to be increased. This is considered to be the reason for the poor crystalline quality and the lower light emission output in the second comparative example compared with the first example.

The output in the third comparative example is lower than that in the first comparative example. This is considered to be because the large thickness of the first layer BL1 makes it hard to obtain a sufficient flattening effect in the second layer BL2, and thus the light emitting layer 40 is deteriorated when the p-type semiconductor layer 50 is formed at a high temperature.

The output in the fourth comparative example is lower than that in the first comparative example. In the case where the Al composition ratio x of the second layer BL2 is larger than 0.1, the surface flatness of the second layer BL2 is deteriorated by the excessively supplied Al, and this leads to an efficiency reduction. In the fourth comparative example, the excessively high Al composition ratio deteriorates the surface flatness of the second layer BL2. This is considered to be the reason for the deterioration in crystalline quality of the barrier layer 41. Further, increased strain and defects in the well layer 42 are considered to be the reason for the lower output.

In contrast, in the semiconductor light emitting device 120 according to the first example, the well layer 42 having a uniform film thickness is formed, and formation of defects in the barrier layer 41 is suppressed. This improves the light emission output (light emitting efficiency) compared with any of the comparative examples described above. Further, the formation of the uniform well layer 42 also increases the yield of the semiconductor light emitting device 120.

(Second Embodiment)

A second embodiment of the invention is a method for manufacturing a semiconductor light emitting device.

This manufacturing method is a method for manufacturing a semiconductor light emitting device including: an n-type semiconductor layer 20 including a nitride semiconductor; a p-type semiconductor layer 50 including a nitride semiconductor; multiple barrier layers 41 including a nitride semiconductor and provided between the n-type semiconductor layer 20 and the p-type semiconductor layer 50; and well layers 42 each provided between the adjacent two of the multiple barrier layers 41 and having a band gap energy smaller than that of the barrier layer 41.

Figure 9:
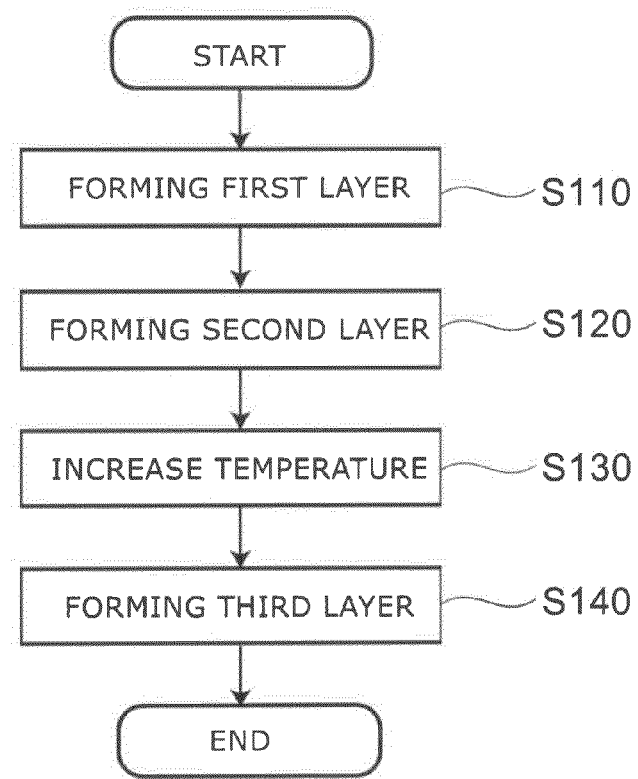
FIG. 9 is a flowchart showing a method for manufacturing a semiconductor light emitting device.

FIG. 9 is a flowchart illustrating the method for manufacturing a semiconductor light emitting device according to the second embodiment.

As shown in FIG. 9, this manufacturing method includes a formation process of the barrier layer 41 which includes the following processes.

The formation process of the barrier layer 41 includes: forming a first layer BL1 on a well layer 41 (Step S110); forming a second layer BL2 on the first layer BL1, the second layer BL2 including $Al_xGa_{1-x}N$ ($0<x\leqq0.05$) and having a band gap energy larger than that of the first layer BL1 (Step S120); increasing the temperature (Step S130); and forming a third layer BL3 on the second layer BL2 at a temperature higher than that for formation of the first layer BL1 and the second layer BL2, the third layer BL3 having a band gap energy smaller than that of the second layer BL2 and having a thickness not smaller than a total thickness of the first and second layers BL1 and BL2 (Step S140).

Here, in Step S110 and Step S120, the growth temperature of the first layer BL1 and the second layer BL2 is, for example, 600° C. to 1000° C.

In Step S140, the growth temperature of the third layer BL3 is higher than that of the first layer BL1 and the second layer BL2, and is, for example, 700° C. to 1000° C.

In the case where the growth atmospheres and raw material gases vary between the third layer BL3 and the first and second layers BL1 and BL2, the growth conditions can be changed in Step S130.

Moreover, a growth interruption may be provided between the processes. Specifically, for example, a period for introducing only a group V raw material gas may be provided. By providing such a growth interruption, the interface abruptness between the barrier layers BL is improved.

A $NH_3$ gas, for example, can be used for the group V raw material gas.

On the other hand, for a group III raw material gas, for example, an organic metal Ga compound gas such as $Ga(CH_3)_3$ and $Ga(C_2H_5)_3$, and an organic metal In compound gas such as $In(CH_3)_3$ and $In(C_2H_5)_3$ can be used. Moreover, in the case where the barrier layers BL and the well layers WL include Al, an organic metal Al compound gas such as $Al(CH_3)_3$ and $Al(C_2H_5)_3$, for example, can be used as the group III raw material.

The method for manufacturing a semiconductor light emitting device according to this embodiment enables manufacturing a semiconductor light emitting device having improved light emitting efficiency.

Although an example is described in which the light emitting layer 40 has the MQW structure including multiple sets of the barrier layers 41 sandwiching the well layers 42 therebetween, the light emitting layer 40 may have a single quantum well (SQW) structure including one set of barrier layers 41 sandwiching well layers 42 therebetween.

The semiconductor light emitting device and manufacturing method thereof according to this embodiment can be applied to a ultraviolet, blue-violet, blue or green laser diode (LD) as well as a ultraviolet, blue-violet, blue or green LED.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

Hereinabove, exemplary embodiments of the invention are described with reference to specific examples. However, the invention is not limited to these specific examples. For example, various modifications made by one skilled in the art in regard to the configurations, sizes, material qualities, arrangements, etc., of components of semiconductor light emitting devices such as n-type semiconductor layers, p-type semiconductor layers, light emitting layers, well layers, barrier layers, electrodes, substrates, and buffer layers are included in the scope of the invention to the extent that the purport of the invention is included.

Further, any two or more components of the specific examples may be combined within the extent of technical feasibility; and are included in the scope of the invention to the extent that the purport of the invention is included.

Moreover, all semiconductor light emitting devices practicable by an appropriate design modification by one skilled in the art based on the semiconductor light emitting devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device comprising:
    an n-type semiconductor layer including a nitride semiconductor;
    a p-type semiconductor layer including a nitride semiconductor;
    an emitting layer including;
        a plurality of barrier layers provided between the n-type semiconductor layer and the p-type semiconductor layer, the barrier layers including a nitride semiconductor; and
        a well layer provided between the plurality of barrier layers, having a band gap energy smaller than a band gap energy of the barrier layers, and including InGaN,
    at least one of the plurality of barrier layers including:
        a first layer;
        a second layer provided closer to the p-type semiconductor layer than the first layer; and
        a third layer provided closer to the p-type semiconductor layer than the second layer,
    the second layer including $Al_xGa_{1-x}N$ ($0<x \leq 0.05$), where x is an atomic ratio of Al among group III elements,
    a band gap energy of the second layer being larger than a band gap energy of the first layer and a band gap energy of the third layer,
    a total thickness of the first layer and the second layer being not larger than a thickness of the third layer.

2. The device according to claim 1, wherein the first layer is in contact with the well layer.

3. The device according to claim 1, wherein the first layer includes In.

4. The device according to claim 1, wherein
    the first layer includes $Al_{y1}In_{z1}Ga_{1-y1-z1}N$ ($0 \leq y1 \leq 1$, $0 \leq z1 \leq 1$, $0 \leq y1+z1 \leq 1$), where y1 is an atomic ratio of Al among group III elements and z1 is an atomic ratio of In among group III elements, and
    the third layer includes $Al_{y2}In_{z2}Ga_{1-y2-z2}N$ ($0 \leq y2 \leq 1$, $0 \leq z2 < 1$, $0 \leq y2+z2 \leq 1$), where y2 is an atomic ratio of Al among group III elements and z2 is an atomic ratio of In among group III elements.

5. The device according to claim 1, wherein
    a thickness of the first layer is not smaller than a thickness of one monolayer and not larger than 5 nanometers, and
    a thickness of the second layer is not smaller than a thickness of one monolayer and not larger than 5 nanometers.

6. The device according to claim 3, wherein a composition of the first layer is identical to a composition of the third layer.

7. The device according to claim 3, wherein a composition of the first layer is different from a composition of the third layer.

8. The device according to claim 1, wherein the emitting layer has a multiple quantum well structure in which the well layers are provided.

9. The device according to claim 1, wherein the emitting layer has a single quantum well structure in which single of the well layer is provided.

10. The device according to claim 1, further comprising a superlattice layer provided between the n-type semiconductor layer and the emitting layer.

11. The device according to claim 10, wherein the superlattice layer includes a plurality of InGaN layers and a plurality of GaN layers alternately stacked.

12. A semiconductor light emitting device comprising:
a substrate;
an n-type semiconductor layer including a nitride semiconductor;
a p-type semiconductor layer including a nitride semiconductor;
an emitting layer including;
   a plurality of barrier layers provided between the n-type semiconductor layer and the p-type semiconductor layer, the barrier layers including a nitride semiconductor; and
   a well layer provided between the plurality of barrier layers, having a band gap energy smaller than a band gap energy of the barrier layers, and including InGaN,
at least one of the plurality of barrier layers including:
   a first layer;
   a second layer provided closer to the p-type semiconductor layer than the first layer; and
   a third layer provided closer to the p-type semiconductor layer than the second layer,
the second layer including $Al_xGa_{1-x}N$ ($0<x\leqq0.05$), where x is an atomic ratio of Al among group III elements,
a band gap energy of the second layer being larger than a band gap energy of the first layer and a band gap energy of the third layer,
a total thickness of the first layer and the second layer being not larger than a thickness of the third layer.

13. The device according to claim 12, wherein the first layer is in contact with the well layer.

14. The device according to claim 12, wherein
the first layer includes $Al_{y1}In_{z1}Ga_{1-y1-z1}N$ ($0\leqq y1\leqq 1$, $0\leqq z1\leqq 1$, $0\leqq y1+z1\leqq 1$), where y1 is an atomic ratio of Al among group III elements and z1 is an atomic ratio of In among group III elements, and
the third layer includes $Al_{y2}In_{z2}Ga_{1-y2-z2}N$ ($0\leqq y2\leqq 1$, $0\leqq z2\leqq 1$, $0\leqq y2+z2\leqq 1$), where y2 is an atomic ratio of Al among group III elements and z2 is an atomic ratio of In among group III elements.

15. The device according to claim 12, wherein
a thickness of the first layer is not smaller than a thickness of one monolayer and not larger than 5 nanometers, and
a thickness of the second layer is not smaller than a thickness of one monolayer and not larger than 5 nanometers.

16. A method for manufacturing a semiconductor light emitting device including: an n-type semiconductor layer including a nitride semiconductor; a p-type semiconductor layer including a nitride semiconductor; a plurality of barrier layers provided between the n-type semiconductor layer and the p-type semiconductor layer, the barrier layers including a nitride semiconductor; and a well layer provided between the plurality of barrier layers, having a band gap energy smaller than a band gap energy of the barrier layers, and including InGaN, the method comprising:
forming at least one of the barrier layers, the forming barrier layers including:
   forming a first layer on the well layer;
   forming a second layer on the first layer, the second layer including $Al_xGa_{1-x}N$ ($0<x\leqq0.05$), where x is an atomic ratio of Al among group III elements, and having a band gap energy larger than a band gap energy of the first layer; and
forming a third layer on the second layer at a temperature higher than a temperature for the forming of the first layer and the forming of the second layer, the third layer having a band gap energy smaller than the band gap energy of the second layer and having a thickness not smaller than a total thickness of the first layer and the second layer.

17. The method according to claim 16, wherein the forming the first layer includes forming the first layer in contact with the well layer.

18. The method according to claim 16, wherein
the first layer includes $Al_{y1}In_{z1}Ga_{1-y1-z1}N$ ($0\leqq y1\leqq 1$, $0\leqq z1\leqq 1$, $0\leqq y1+z1\leqq 1$), where y1 is an atomic ratio of Al among group III elements and z1 is an atomic ratio of In among group III elements, and
the third layer includes $Al_{y2}In_{z2}Ga_{1-y2-z2}N$ ($0\leqq y2\leqq 1$, $0\leqq z2\leqq 1$, $0\leqq y2+z2\leqq 1$), where y2 is an atomic ratio of Al among group III elements and z2 is an atomic ratio of In among group III elements.

19. The method according to claim 16, wherein
a thickness of the first layer is not smaller than one monolayer and not larger than 5 nanometers, and
a thickness of the second layer is not smaller than one monolayer and not larger than 5 nanometers.

20. The method according to claim 16, where in the forming at least one of the barrier layers is performed on the well layer formed on a superlattice layer provided on the n-type semiconductor layer.

* * * * *